United States Patent
Ali et al.

(10) Patent No.: US 9,465,404 B2
(45) Date of Patent: Oct. 11, 2016

(54) TIMING SYNCHRONIZATION CIRCUIT FOR WIRELESS COMMUNICATION APPARATUS

(71) Applicants: Inayat Ali, Noida (IN); Arvind Kaushik, Ghaziabad (IN); Sachin Prakash, Noida (IN); Arindam Sinha, Noida (IN)

(72) Inventors: Inayat Ali, Noida (IN); Arvind Kaushik, Ghaziabad (IN); Sachin Prakash, Noida (IN); Arindam Sinha, Noida (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 198 days.

(21) Appl. No.: 14/452,535

(22) Filed: Aug. 6, 2014

(65) Prior Publication Data

US 2016/0041579 A1   Feb. 11, 2016

(51) Int. Cl.
| | |
|---|---|
| G06F 1/04 | (2006.01) |
| G06F 1/08 | (2006.01) |
| G06F 1/10 | (2006.01) |
| H03L 7/00 | (2006.01) |
| H04B 15/00 | (2006.01) |
| H03J 7/00 | (2006.01) |

(52) U.S. Cl.
CPC . *G06F 1/08* (2013.01); *G06F 1/10* (2013.01); *H03J 7/00* (2013.01); *H03L 7/00* (2013.01); *H04B 15/00* (2013.01)

(58) Field of Classification Search
None
See application file for complete search history.

(56) References Cited

U.S. PATENT DOCUMENTS

| | | |
|---|---|---|
| 5,608,765 A | 3/1997 | Tanoue |
| 7,397,808 B2 | 7/2008 | Lee et al. |
| 8,760,325 B2 | 6/2014 | Ryan |
| 2001/0036168 A1 | 11/2001 | Terry |
| 2003/0009714 A1* | 1/2003 | Evans ............ G01R 31/318502 714/726 |
| 2010/0137025 A1* | 6/2010 | Tal ......................... H04B 15/02 455/553.1 |

* cited by examiner

*Primary Examiner* — Paul Yanchus, III

(57) ABSTRACT

A transmission node includes a digital front-end device that provides functional clocks for JESD204B based data transmission. The front-end device includes a PLL for generating a phase locked clock based on a device clock of the front-end device, a clock dividing unit for generating the functional clocks by dividing the phase locked clock, a clock gating unit connected between the PLL and the clock dividing unit, and a system reference signal sampling unit for timing radio frame boundaries. The clock gating unit gates the phase locked clock to align the functional clocks with the device clock within a predetermined number of cycles of the phase locked clock, upon locking of the PLL or receipt of a system resynchronization request. The system reference signal sampling unit samples the system reference signal with zero-cycle latency between device clock and phase locked clock.

18 Claims, 6 Drawing Sheets

TIMING SYNCHRONIZATION CIRCUIT FOR WIRELESS COMMUNICATION APPARATUS

BACKGROUND OF THE INVENTION

The present invention relates to wireless communication systems and, more particularly, to a method of multichip synchronization in a remote radio head.

FIG. 1 shows a topology of a multichip remote radio head (RRH) environment of a transmission node 100 in a wireless communication network. The transmission node 100 includes at least two digital front-end devices 102 and 104 controlled by a system controller 106. Each of the digital front-end devices 102 and 104 respectively communicates with one of radio frequency interface chips (RFICs) 108 and 110 using the JESD204B protocol, which is a serial protocol. A RFIC is a device that has an analog to digital converter (ADC), a digital to analog converter (DAC) and an interface to a radio frequency physical antenna (RF PA), such as antennas 112 and 114. The JESD204B protocol requires a plurality of functional clocks provided by the digital front-end devices 102 and 104 indicating different timing boundaries, such as a character clock, a bi-character clock, a quad-character clock depending on a size of the bus implemented in JESD204B transports, and a programmable generated clock. The plurality of functional clocks are generated by dividing a phase locked clock using different division ratios dictated by serial line rates. The phase locked clock is generated from a device clock of each front-end device 102, 104 by a phase locked loop (PLL) (not shown). It is required that all of the functional clocks have a positive edge aligned at a functional start of the transports, which happens after booting or reset, or upon a re-synchronization request 116. The multichip resynchronization is required to be completed within one radio frame with a length of 10 ms.

The topology further requires stringent sampling certainty of a system reference signal SYSREF 118, which dictates the radio frame timing boundaries to the digital front-end devices 102 and 104. The SYSREF 118 is sampled by a device clock 120 of the digital front-end device 102, 104. Since JESD204B works on a phase locked clock 122 generated by the PLL in each digital front-end device 102, 104, the SYSREF sampling is required to be aligned with both the device clock 120 and the phase locked clock 122. However, as shown in FIG. 2, PLL jitter moves the edge of the phase locked clock 122 either behind or ahead of the edge of an ideal phase locked clock PLL_CLK, as shown by PLL_CLK' 124 and PLL_CLK" 126, which results in a high probability of either a hold or setup violation.

It is therefore necessary to align all of the functional clocks with the device clock upon a reset or system re-synchronization request, or PLL re-locking, and ensure deterministic sampling of the system reference signal.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

Figure 1:
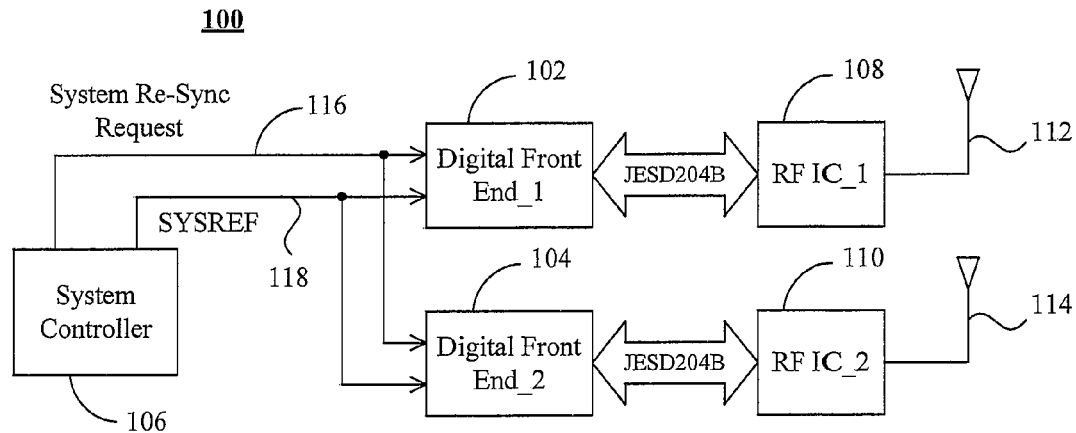
FIG. 1 is a schematic block diagram of a transmission node having multiple digital front-end devices providing a plurality of internal clocks for data transmission.
Figure 2:
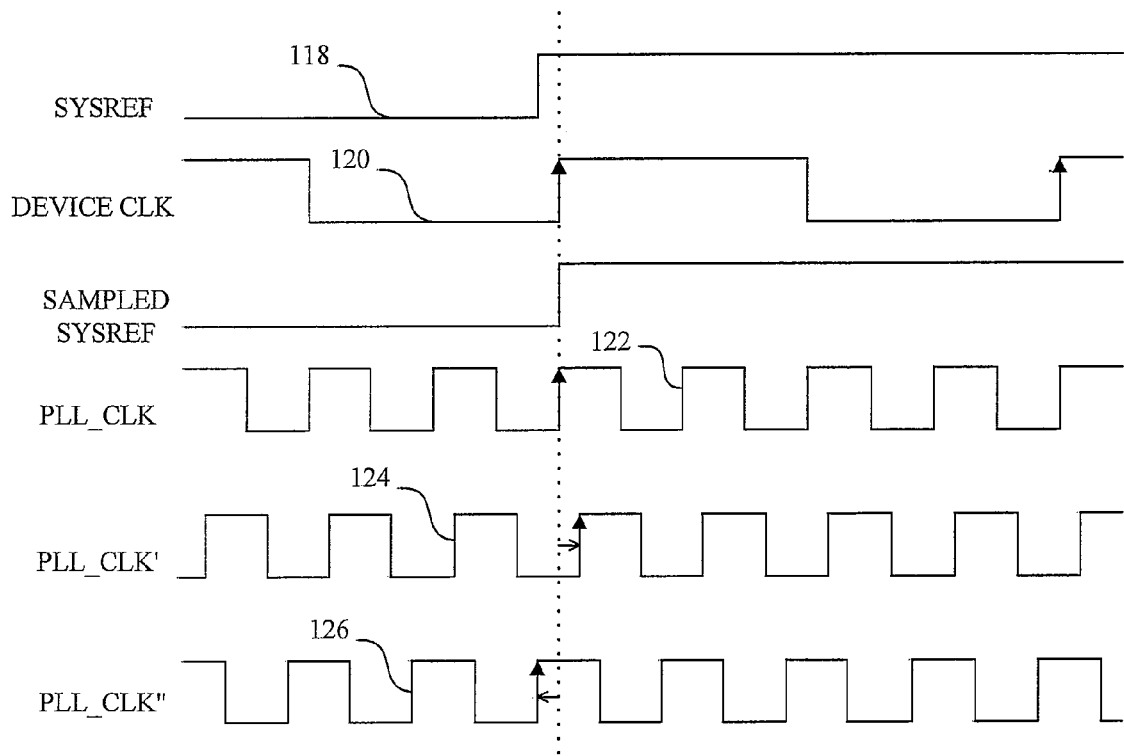
FIG. 2 shows waveforms of clocks effected by PLL jitter.

The detailed description set forth below in connection with the appended drawings is intended as a description of presently preferred embodiments of the invention, and is not intended to represent the only forms in which the present invention may be practised. It is to be understood that the same or equivalent functions may be accomplished by different embodiments that are intended to be encompassed within the spirit and scope of the invention. In the drawings, like numerals are used to indicate like elements throughout. Furthermore, the terms "comprises," "comprising," or any other variation thereof, are intended to cover a non-exclusive inclusion, such that module, circuit, device components, structures and method steps that have a list of elements or steps does not include only those elements but may include other elements or steps not expressly listed or inherent to such module, circuit, device components or steps. An element or step proceeded by "comprises . . . a" does not, without more constraints, preclude the existence of additional identical elements or steps that comprises the element or step.

In one embodiment, the present invention provides a transmission node for use in a wireless communication network. The transmission node includes a digital front-end device that provides a plurality of functional clocks for data transmission. The digital front-end device includes a phase locked loop (PLL) for generating a phase locked clock based on a device clock of the digital front-end device, and a clock dividing unit having at least one frequency divider that generates the plurality of functional clocks by dividing the phase locked clock, and a clock gating unit connected between the PLL and the clock dividing unit for gating the phase locked clock provided to the clock dividing unit to align the functional clocks within one cycle of the device clock upon locking of the PLL or receipt of a system resynchronization request.

In another embodiment, the present invention provides a method of operating a transmission node for use in a wireless communication network. The transmission node includes a digital front-end device that provides a plurality of functional clocks for data transmission. The method includes generating a phase locked clock based on a device clock of the digital front-end device by a phase locked loop, generating the plurality of functional clocks by dividing the phase locked clock with a clock dividing unit, and gating the phase locked clock to align the plurality of functional clocks within a predetermined number of cycles of the phase locked clock upon locking of the PLL or receipt of a resynchronization request.

Figure 3:
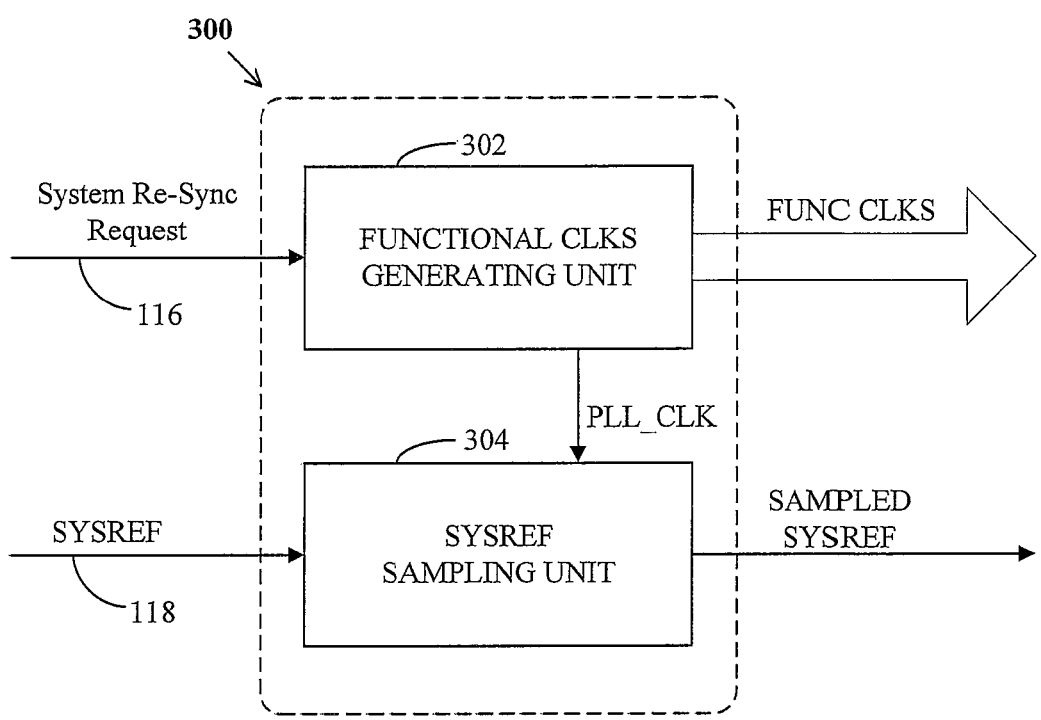
FIG. 3 is a schematic block diagram of a digital front-end device in accordance with an embodiment of the invention.

Referring now to FIG. 3, a digital front-end device 300 in accordance with an embodiment of the invention is shown. The digital front-end device 300 includes a functional clocks generating unit 302 for generating a plurality of functional clocks for data transmission and aligning the plurality of functional clocks upon resetting or receipt of the system re-synchronization request 116 received from the system controller 106 as shown in FIG. 1. In a preferred embodiment, the digital front-end device 300 further includes a system reference signal sampling unit 304 for sampling the system reference signal 118 with a device clock of the digital front-end device 300 and further aligning a phase locked clock PLL_CLK provided by the functional clocks generating unit 302 with the device clock.

Figure 4:
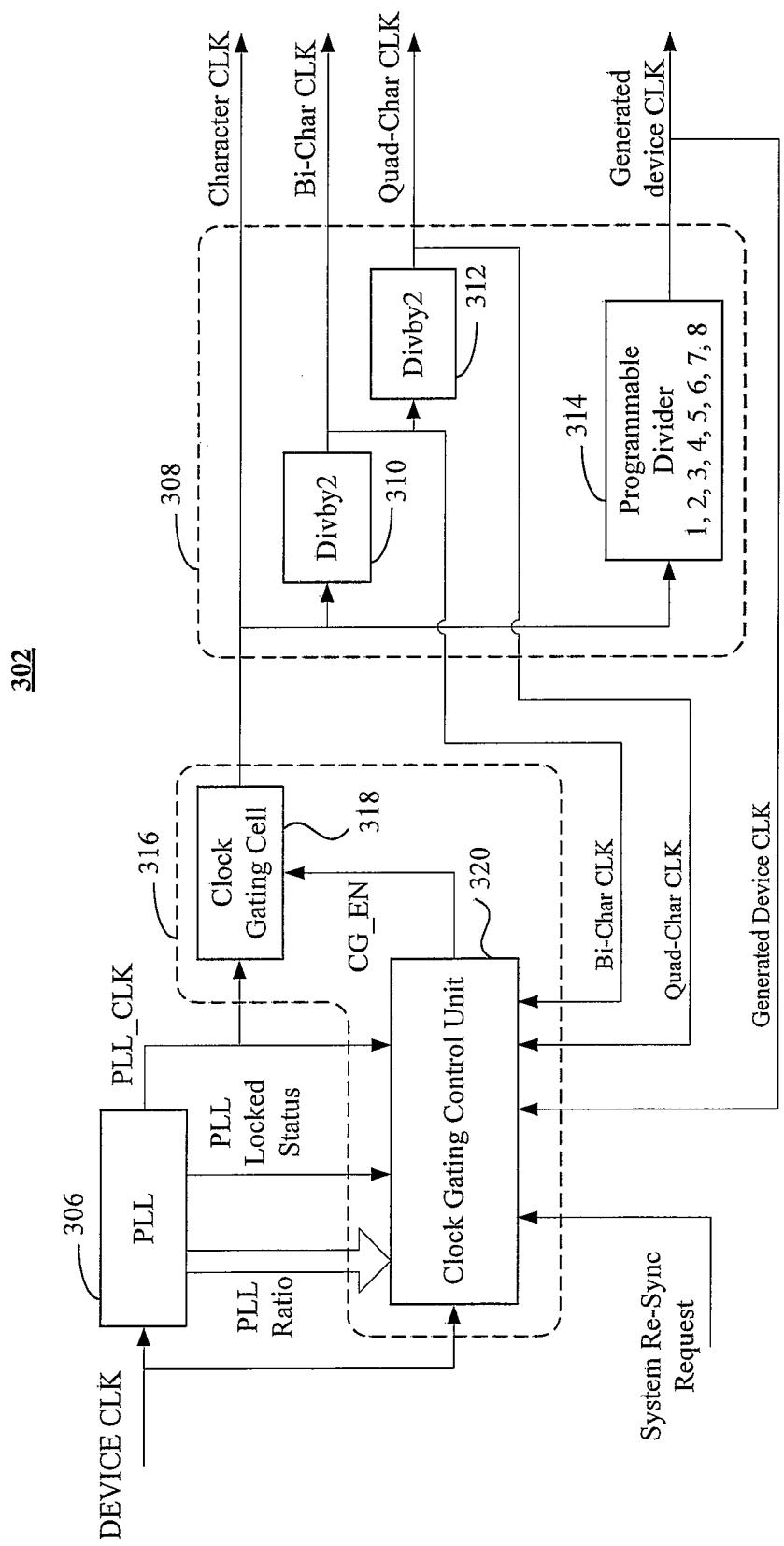
FIG. 4 is a schematic block diagram of a functional clocks generating unit of a digital front-end device in accordance with an embodiment of the invention.

FIG. 4 shows a schematic block diagram of the functional clocks generating unit 302 of the digital front-end device 300 in accordance with an embodiment of the invention. The functional clocks generating unit 302 includes a phase locked loop (PLL) 306 for generating the phase locked clock PLL_CLK based on the device clock of the digital front-end device 300. In a preferred embodiment, the PLL 306 multiplies the device clock by a multiplication ratio in generating the phase locked clock PLL_CLK. The phase locked clock PLL_CLK is used as a character clock, which is one of the plurality of functional clocks that indicates boundaries of data with a length of one character.

The functional clocks generating unit 302 further includes a clock dividing unit 308 that includes a plurality of frequency dividers that generate the plurality of functional clocks by dividing the phase locked clock PLL_CLK with different division ratios. In a preferred embodiment, the plurality of frequency dividers includes a first divide-by-2 divider 310 for providing a bi-character clock indicating boundaries of data with a length of two characters, a second divide-by-2 divider 312 cascaded to the first divide-by-2 divider 310 for providing a quad-character clock indicating boundaries of data with a length of four characters. In a preferred embodiment, the plurality of frequency dividers includes a programmable divider 314 that divides the phase locked clock PLL_CLK with a predetermined division ratio, such as one of integers ranging from 1 to 8, for providing a generated device clock.

A clock gating (CG) unit 316 is connected between the PLL 306 and the clock dividing unit 308 for gating the phase locked clock PLL_CLK provided to the clock dividing unit 308. The CG unit 316 includes a clock gating cell 318 and a clock gating control unit 320. The clock gating cell 318 gates the phase locked clock PLL_CLK based on a CG enable signal CG_EN generated by the clock gating control unit 320. The clock gating control unit 320 generates the CG enable signal CG_EN based on the plurality of functional clocks, and a PLL locked status signal or a system resynchronization request, so that the plurality of functional clocks are aligned within a predetermined number of cycles of the phase locked clock PLL_CLK upon locking of the PLL 306 or receipt of the system resynchronization request.

Figure 5:
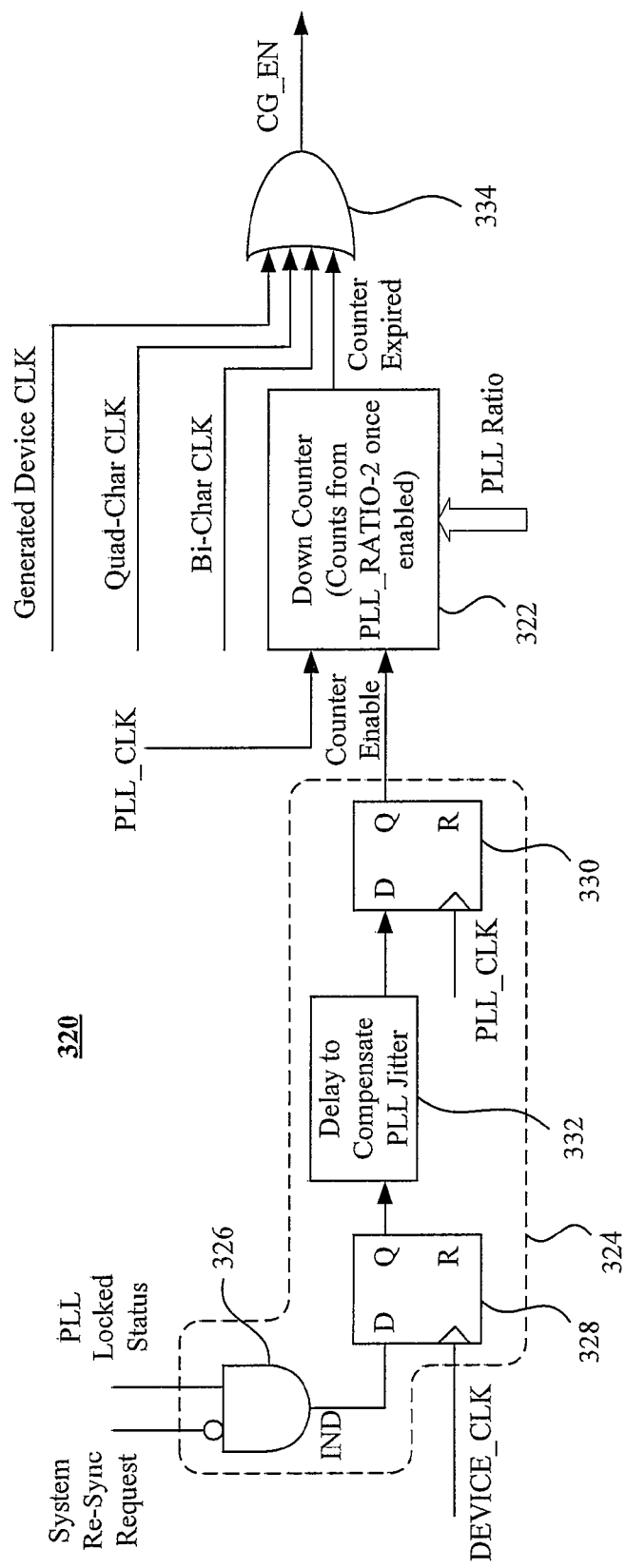
FIG. 5 is a schematic block diagram of a detailed structure of the clock gating control unit of the functional clocks generating unit of FIG. 4 in accordance with an embodiment of the invention.

Referring now to FIG. 5, a schematic block diagram of a detailed structure of the clock gating control unit 320 of the functional clocks generating unit 302 in accordance with an embodiment of the invention is shown. The clock gating control unit 320 includes a counter 322 for generating a counter expired signal when a number of cycles of the phase locked clock have been reached. In a preferred embodiment, the number equals the multiplication ratio minus one, the counter 322 down counts from the multiplication ratio minus two till zero once enabled, so that the counter expired signal indicates arrival of a next cycle of the device clock.

The counter 322 is enabled by a counter enable signal generated by a counter enable generator 324, which is connected to the counter 322. The count enable signal is generated based on an indication signal IND, which is asserted when the PLL is locked and the re-synchronization request is not asserted. In a preferred embodiment, the indication signal is generated by an AND gate 326, wherein an invert input of the AND gate 326 receives the resynchronization request and another input of the AND gate 326 receives the PLL locked status signal from the PLL 306.

In a preferred embodiment, the counter enable generator 324 includes a first flip-flop 328 for synchronizing the indication signal IND with the device clock, and a second flip-flop 330 connected to the first flip-flop 328 through a first delay unit 332 for aligning the indication signal IND with the phase locked clock PLL_CLK. The length of the delay provided by the first delay unit 332 is determined by a maximum phase jitter of the PLL 306 to compensate for PLL jitter.

The clock gating control unit 320 further includes a logic gate 334 for generating the CG enable signal based on the plurality of functional clocks and the counter expired signal. In a preferred embodiment, the logic gate 334 is an OR gate, so that the CG cell 318 gates the phase locked clock PLL_CLK when the counter expired signal and the plurality of functional clocks are all de-asserted.

Figure 6:
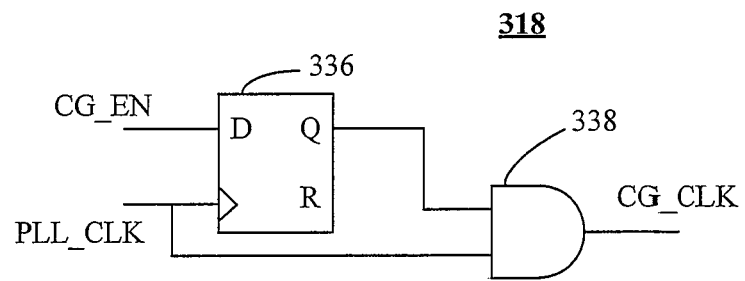
FIG. 6 is a schematic block diagram of a detailed structure of the clock gating cell of the functional clocks generating unit of FIG. 4 in accordance with an embodiment of the invention.

FIG. 6 shows a schematic block diagram of a detailed structure of the CG cell 318 in accordance with an embodiment of the invention. The CG cell 318 includes a latch 336 receiving the CG enable signal. The latch 336 is clocked by the phase locked clock PLL_CLK. An output of the latch 336 goes to a first input of an AND gate 338. The second input of the AND gate 338 is the phase locked clock PLL_CLK which is to be gated.

Figure 7:
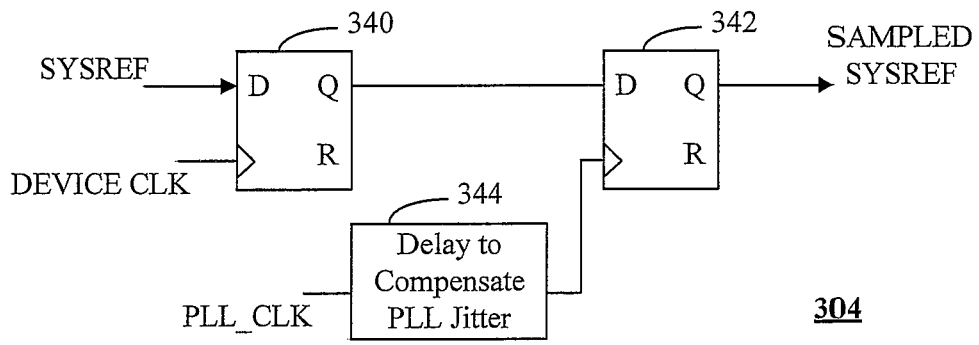
FIG. 7 is a schematic block diagram of a system reference signal sampling unit of the digital front-end device in accordance with an embodiment of the invention.

Referring now to FIG. 7, a schematic block diagram of the system reference signal sampling unit 304 of the digital front-end device 300 in accordance with an embodiment of the invention is shown. The system reference signal sampling unit 304 includes a third flip-flop 340 having a first data input terminal that receives the system reference signal SYSREF, and a first clock input terminal that receives the device clock, so that the system reference signal SYSREF is first sampled by the device clock. A second data input terminal of a fourth flip-flop 342 is connected to a first output terminal of the third flip-flop 340, and a second clock input terminal of the fourth flip-flop 342 is connected to the PLL 306 for receiving the phase locked clock PLL_CLK. The phase locked clock PLL_CLK is delayed by a second delay unit 344 before being provided to the second flip-flop 342 so that the system reference signal is further sampled at an edge of the phase locked clock PLL_CLK that is aligned with an edge of the device clock.

Figure 8:
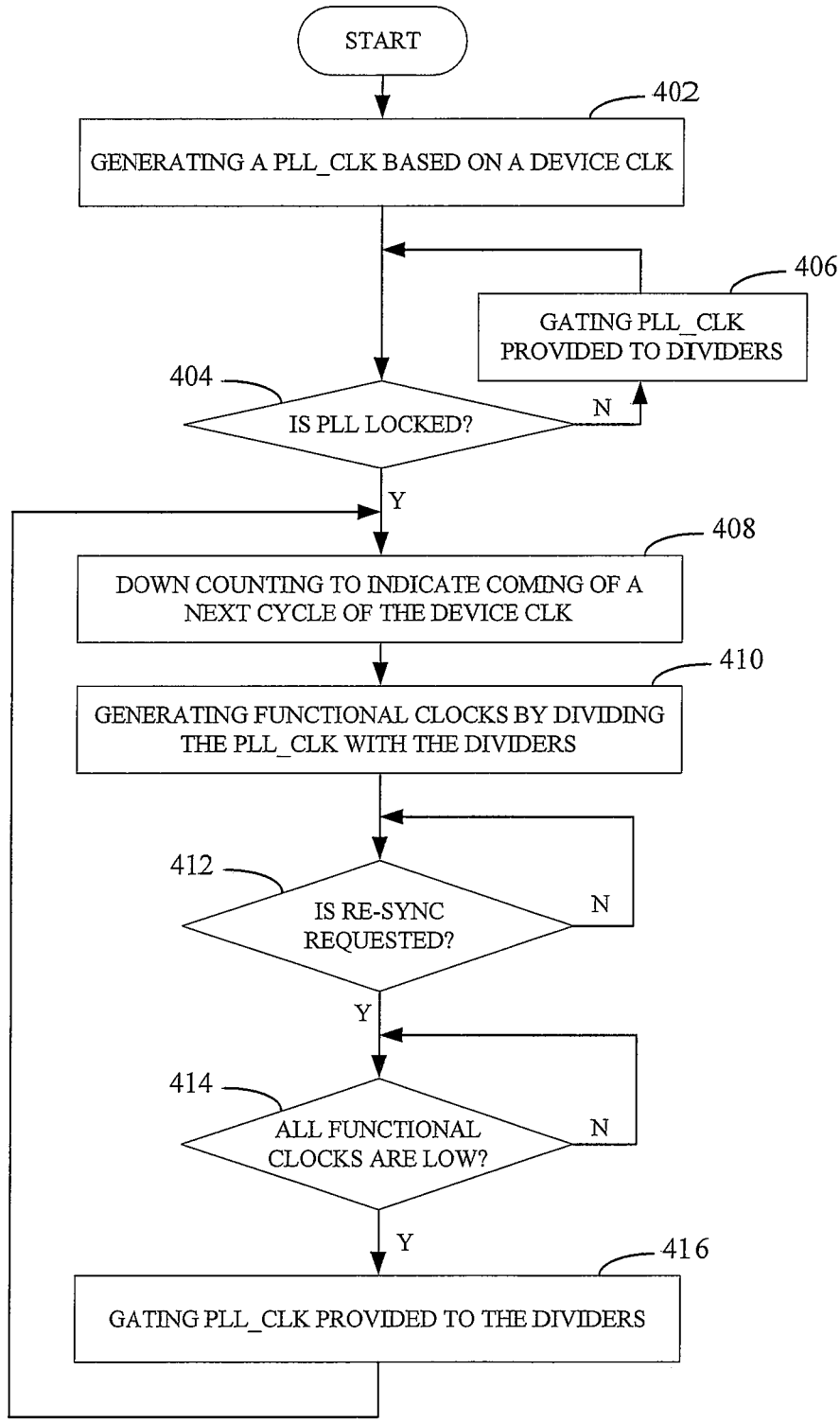
FIG. 8 is a flow chart illustrating a method of operating a transmission node for providing a plurality of functional clocks for data transmission in accordance with an embodiment of the present invention.

FIG. 8 is a flow chart illustrating a method 400 of providing and aligning a plurality of functional clocks for data transmission in accordance with an embodiment of the present invention. The plurality of functional clocks are generated by a digital front-end device in a transmission node.

The method 400 starts at step 402 by using a phase locked loop (PLL) 306 (FIG. 4) to generate a phase locked clock PLL_CLK based on a device clock of the digital front-end device. In more detail, generating the phase locked clock PLL_CLK includes multiplying the device clock by a multiplication ratio.

At steps 404 and 406, the phase locked clock PLL_CLK is gated by a clock gating cell 316 (FIG. 4), so that the phase locked clock PLL_CLK will not be provided to a plurality of frequency dividers until the PLL 306 is locked. The plurality of frequency dividers are used for generating the plurality of functional clocks based on the phase locked clock PLL_CLK.

At step 408, once the PLL 306 is locked, a counter 322 (FIG. 5) is enabled to down count cycles of the phase locked clock PLL_CLK from a predetermined number till zero, and generate a counter expired signal when the counter reaches zero. In a preferred embodiment, the predetermined number equals the multiplication ratio minus two, so that the counter expired signal generated by the counter 322 indicates arrival of a next cycle of the device clock.

At step 410, the counter expired signal stops the clock gating cell 316 from gating the phase locked clock PLL_CLK, so that the phase locked clock PLL_CLK is provided to the plurality of frequency dividers, and the plurality of frequency dividers generate the plurality of functional clocks. Therefore, the plurality of functional clocks are generated and aligned at a first edge of the next cycle of the device clock. In a preferred embodiment, the plurality of functional clocks includes a character clock which is same as the phase locked clock PLL_CLK, a bi-character clock generated by dividing the phase locked clock PLL_CLK by two, a quad-character clock generated by further dividing the bi-character clock by two, and a generated device clock generated by dividing the phase locked clock PLL_CLK by a predetermined division ratio with a programmable frequency divider. In a preferred embodiment, the predetermined division ratio is one of integers ranging from 1 to 8.

At step 412, once a system resynchronization request is received, the counter 322 (FIG. 5) is disabled, and at steps 414 and 416, the phase locked clock PLL_CLK is gated by the clock gating cell 316 (FIG. 4) again when all of the functional clocks are low. In a preferred embodiment, the system resynchronization request is a pulse signal aligned with the device clock.

Going back to step 408, once the system resynchronization request goes low, the counter 322 is enabled again to down count cycles of the phase locked clock PLL_CLK from the predetermined number till zero, and generate a counter expired signal when the counter reaches zero. In a preferred embodiment, the predetermined number equals the multiplication ratio minus two, so that the counter expired signal generated by the counter 322 indicates the arrival of a next cycle of the device clock upon the system resynchronization request. Therefore, as previously discussed on step 410, the plurality of functional clocks are provided and aligned at a first edge of the next cycle of the device clock.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

What is claimed is:

1. A transmission node comprising a digital front-end device that provides a plurality of functional clocks for data transmission, the digital front-end device comprising:
   a phase locked loop (PLL) for generating a phase locked clock based on a device clock of the digital front-end device, wherein generating the phase locked clock includes multiplying the device clock by a multiplication ratio;
   a clock dividing unit comprising at least one frequency divider that generates the plurality of functional clocks by dividing the phase locked clock; and
   a clock gating (CG) unit connected between the PLL and the clock dividing unit for gating the phase locked clock to align the plurality of functional clocks within a predetermined number of cycles of the phase locked clock upon a reset or resynchronization request;
   wherein the CG unit comprises:
      a clock gating cell and a CG control unit connected to the clock gating cell for generating a CG enable signal;
      a counter for generating a counter expired signal indicating arrival of a phase locked clock cycle with the predetermined number of cycles upon locking of the PLL or receipt of the resynchronization request;
      a counter enable generator connected to the counter for generating a counter enable signal based on an indication signal, wherein the indication signal is asserted when the PLL is locked and re-synchronization is not requested; and
      a logic gate for generating the CG enable signal based on the plurality of functional clocks and the counter expired signal.

2. The transmission node of claim 1, wherein the counter enable generator comprises a first flip-flop for synchronizing the indication signal with the device clock.

3. The transmission node of claim 2, wherein the counter enable generator further comprises a second flip-flop connected to the first flip-flop through a first delay unit for aligning the indication signal with the phase locked clock.

4. The transmission node of claim 1, wherein the predetermined number of cycles is determined by the multiplication ratio, and the counter expires when a number of cycles of the phase locked clock have been reached, wherein the number equals the multiplication ratio minus one, so that the counter expired signal indicates arrival of a next cycle of the device clock upon locking of the PLL or receipt of the resynchronization request.

5. The transmission node of claim 1, wherein the CG cell latches the phase locked clock when the counter expired signal and the plurality of functional clocks are all de-asserted.

6. The transmission node of claim 1, wherein the clock dividing unit comprises a plurality of frequency dividers for generating the plurality of functional clocks, wherein the plurality of functional clocks comprises:
   a character clock that is the same as the phase locked clock,
   a bi-character clock having a frequency that is half of the frequency of the character clock,
   a quad-character clock having a frequency that is a quarter of the frequency of the character clock, and
   a generated device clock generated by dividing the phase locked clock by a division ratio determined in a programmable frequency divider.

7. The transmission node of claim 1, wherein the digital front-end device further comprises a system reference signal sampling unit for sampling a system reference signal with the phase locked clock.

8. The transmission node of claim 7, wherein the system reference signal sampling unit comprises:

a third flip-flop having a first data input terminal that receives the system reference signal, and a first clock input terminal that receives the device clock; and a fourth flip-flop having a second data input terminal connected to a first output terminal of the third flip-flop and a second clock input terminal connected to the PLL for receiving the phase locked clock, wherein the phase locked clock is delayed by a second delay unit before being provided to the second flip-flop so that the system reference signal is sampled at an edge of the phase locked clock that is aligned with an edge of the device clock.

9. A method of operating a transmission node, wherein the transmission node comprises a digital front-end device that provides a plurality of functional clocks for data transmission, the method comprising:

generating a phase locked clock based on a device clock of the digital front-end device with a phase locked loop (PLL), wherein generating the phase locked clock includes multiplying the device clock by a multiplication ratio;

generating the plurality of functional clocks by dividing the phase locked clock with a clock dividing unit;

gating the phase locked clock to align the plurality of functional clocks within a predetermined number of cycles of the phase locked clock upon locking of the PLL or receipt of a resynchronization request; and generating a counter expired signal using a counter, wherein the counter expired signal indicates arrival of a phase locked clock cycle within the predetermined number of cycles of the phase locked clock upon locking of the PLL or receipt of the resynchronization request, and wherein the counter is enabled based on an indication signal that is asserted when the PLL is locked and the re-synchronization request is de-asserted.

10. The method of claim 9, further comprising:

gating the phase locked clock when the counter expired signal and the plurality of internal clocks are all de-asserted.

11. The method of claim 9, further comprising aligning the indication signal with a next cycle of the phase locked clock.

12. The method of claim 9, wherein the predetermined number is determined by the multiplication ratio, and the counter expires when a number of cycles of the phase locked clock have been reached, wherein the number equals the multiplication ratio minus one, so that the counter expired signal indicates the arrival of a next cycle of the device clock upon locking of the PLL or receipt of the resynchronization request.

13. The method of claim 9, wherein the plurality of functional clocks comprises:

a character clock that is the same as the phase locked clock, a bi-character clock having a frequency that is half of the frequency of the character clock, a quad-character clock having a frequency that is a quarter of the frequency of the character clock, and a generated device clock generated by dividing the phase locked clock by a division ratio determined with a programmable frequency divider.

14. The method of claim 9, further comprising delaying the phase locked clock before sampling a system reference signal with the phase locked clock, so that the system reference signal is sampled at an edge of the phase locked clock that is aligned with an edge of the device clock.

15. A transmission node comprising a digital front-end device that provides a plurality of functional clocks for data transmission, the digital front-end device comprising:

a phase locked loop (PLL) for generating a phase locked clock based on a device clock of the digital front-end device, wherein generating the phase locked clock includes multiplying the device clock by a multiplication ratio;

a clock dividing unit comprising at least one frequency divider that generates the plurality of functional clocks by dividing the phase locked clock;

a clock gating (CG) unit connected between the PLL and the clock dividing unit for gating the phase locked clock to align the plurality of functional clocks within a predetermined number of cycles of the phase locked clock upon a reset or resynchronization request; and a system reference signal sampling unit for sampling a system reference signal with the phase locked clock, the system reference signal sampling unit comprising:

a third flip-flop having a first data input terminal that receives the system reference signal, and a first clock input terminal that receives the device clock; and a fourth flip-flop having a second data input terminal connected to a first output terminal of the third flip-flop and a second clock input terminal connected to the PLL for receiving the phase locked clock, wherein the phase locked clock is delayed by a second delay unit before being provided to the second flip-flop so that the system reference signal is sampled at an edge of the phase locked clock that is aligned with an edge of the device clock.

16. The transmission node of claim 15, wherein the predetermined number of cycles is determined by the multiplication ratio.

17. The transmission node of claim 15, wherein the clock dividing unit comprises a plurality of frequency dividers for generating the plurality of functional clocks.

18. The transmission node of claim 15, wherein the digital front-end device further comprises a system reference signal sampling unit for sampling a system reference signal with the phase locked clock.

* * * * *